United States Patent [19]

Rhein

[11] Patent Number: 5,684,405

[45] Date of Patent: Nov. 4, 1997

[54] WET/DRY HOT STICK TESTER

[75] Inventor: David A. Rhein, Columbia, Mo.

[73] Assignee: Hubbell Incorporated, Orange, Conn.

[21] Appl. No.: 690,948

[22] Filed: Aug. 1, 1996

[51] Int. Cl.$^6$ .......................... G01R 31/02; G01R 31/12
[52] U.S. Cl. .......................... 324/551; 324/557; 324/559; 324/133
[58] Field of Search .......................... 324/601, 663, 324/664, 557, 558, 559, 551, 555, 133

[56] References Cited

U.S. PATENT DOCUMENTS

| | | | |
|---|---|---|---|
| 3,193,765 | 7/1965 | Bevins | 324/149 |
| 3,392,334 | 7/1968 | Bevins | 324/149 |
| 3,914,687 | 10/1975 | Bevins | 324/555 |
| 4,558,273 | 12/1985 | Nishimura | 324/557 |
| 4,998,070 | 3/1991 | Rosenberg et al. | 324/557 |
| 5,075,620 | 12/1991 | Shaw | 324/122 |
| 5,136,234 | 8/1992 | Shaw | 324/72 |
| 5,475,313 | 12/1995 | Dykes | 324/557 |

*Primary Examiner*—Ernest F. Karlsen
*Assistant Examiner*—Diep Do
*Attorney, Agent, or Firm*—Jerry M. Presson; William C. Roch

[57] ABSTRACT

A wet/dry hot stick tester designed to provide a dry test of a hot stick by applying a voltage equivalent to 100 KV/ft to the hot stick, and to provide a wet test of a hot stick by applying a voltage equivalent to 75 KV/ft thereto. Output electrodes are positioned along a reading aperture provided in a housing of the hot stick tester, in which a hot stick being tested is positioned. A two tap transformer has a first input tap for providing a first voltage equivalent to 100 KV/ft to a hot stick positioned in the reading aperture during a dry test thereof, and has a second input tap for providing a second voltage equivalent to 75 KV/ft to a hot stick during a wet test thereof. An ammeter measures the leakage current through the hot stick during an applied voltage. A wet/dry switch switches the two tap transformer between the first and second input taps. The wet/dry switch comprises a ganged switch with a first set of contacts which switch between the first and second input taps of the transformer, and a second set of contacts which switch a resistor into and out of a control circuit between the output electrodes [and one output coil of the transformer] and an input to an operational amplifier which drives the ammeter.

9 Claims, 3 Drawing Sheets ics and controls
mounted on top of the portable, self-contained wet/dry hot
stick tester unit of FIG. 1; and

WET/DRY HOT STICK TESTER

BACKGROUND OF THE INVENTION

1. Field of the Invention

The present invention relates generally to a wet/dry hot stick tester, and more particularly pertains to a wet/dry hot stick tester which is provided in a portable, self-contained unit for checking the insulating integrity of electrical live-line tools in accordance with industry standards.

The wet/dry hot stick tester of the present invention is designed to provide a dry test of a hot stick being tested by applying a voltage equivalent to 100 KV/ft to the hot stick, and to provide a wet test of a hot stick being tested by applying a voltage equivalent to 75 KV/ft to the hot stick. The wet/dry hot stick tester is designed to test tools made only of fiberglass-reinforced plastic (FRP) up to 3 inches in diameter, and is designed to detect any leakage current through the tool caused by the applied voltages.

2. Discussion of the Prior Art

An electrical utility pole, commonly referred to as a hot stick, is frequently used by utility company linemen in servicing high-voltage electrical utility transmission lines, underground cables, switch gear, etc. for performing various tests and service operations on the equipment.

Shaw U.S. Pat. No. 5,075,620 is of interest to the general background of the present invention, and relates to a voltage detector/indicator unit for providing an audio and/or visible indication of the voltage carried by high voltage electrical utility transmission lines and switchgear. The detector/indicator unit is mountable upon an electrically insulating pole, commonly referred to as a hot stick, for use by utility company linemen. The detector/indicator can operate at several different voltage levels without requiring manual selection of a particular voltage range so that the operator can easily determine whether full line voltage or a lesser voltage is present on the power line being tested. The voltage detector/indicator unit includes a plurality of lights for indicating a voltage within one of a plural of different voltage ranges by lighting the lights in a selected pattern.

Shaw U.S. Pat. No. 5,136,234 is also of interest to the general background of the present invention, and relates to a digital, high-voltage meter device for providing a visible, digital indication of the approximate voltage carried by high-voltage electrical utility transmission lines, underground cables and switch gear. The digital, high-voltage meter device is mountable on an electrical utility pole, commonly referred to as a hot stick, for use by utility company linemen. The digital, high-voltage meter comprises two poles, each having a probe connected to a high voltage resistor which is connected to a supply low-voltage input to a digital voltmeter.

U.S. Pat. No. 3,193,765 for PLURAL EXTENSIBLE POWER LINE VOLTAGE MEASURMENT PROBES WITH SPOOL MEANS FOR THE INTERCONNECTING CONDUCTOR, by Marvin W. Bevins, U.S. Pat. No. 3,392, 334 for DEVICE FOR MEASURING VOLTAGE BETWEEN HIGH VOLTAGE ELECTRICAL TRANSMISSION LINES, by Marvin W. Bevins, and U.S. Pat. No. 3,914,687 for CONTINUITY TESTING DEVICE FOR A HIGH VOLTAGE MEASUREMENT DEVICE, by Marvin W. Bevins, are also of interest to the background of the present invention.

SUMMARY OF THE INVENTION

Accordingly, it is a primary object of the present invention to provide a wet/dry hot stick tester designed to provide a dry test of a hot stick being tested by applying a voltage equivalent to 100 KV/ft to the hot stick, and to provide a wet test of a hot stick being tested by applying a voltage equivalent to 75 KV/ft to the hot stick.

In accordance with the teachings herein, the present invention provides a wet/dry hot stick tester having output electrodes positioned along a reading aperture provided in the housing of the hot stick tester, in which a hot stick being tested is positioned. A two tap transformer has a first input tap for providing a first voltage equivalent to a first KV/ft to a hot stick positioned in the reading aperture during a dry test thereof, and has a second input tap for providing a second voltage equivalent to a second KV/ft to a hot stick positioned in the reading aperture during a wet test thereof. An aperture is provided for measuring the leakage current through the hot stick positioned in the reading aperture during an applied voltage.

In greater detail, the wet/dry tester comprises a portable self-contained unit for checking the insulation integrity of a hot stick, and the reading aperture comprises an inverted V shaped aperture which is placed over and around a hot stick being tested. A wet/dry switch is provided for switching the two tap transformer between the first and second input taps. In greater detail, the wet/dry switch comprises a ganged switch, a first set of contacts of which switches between the first and second input taps of the transformer, and a second set of contacts of which switches a resistor into and out of a control circuit. In greater detail, the second set of contacts switches the resistor into and out of the control circuit between the output electrodes and an input to an operational amplifier which drives the ammeter.

BRIEF DESCRIPTION OF THE DRAWINGS

The foregoing objects and advantages of the present invention for a wet/dry hot stick tester may be more readily understood by one skilled in the art with reference being had to the following detailed description of a preferred embodiment thereof, taken in conjunction with the accompanying drawings wherein like elements are designated by identical reference numerals throughout the several views, and in which.

DETAILED DESCRIPTION OF THE DRAWINGS

A hot stick is an insulated pole used by utility company linemen to perform various electrical measurements, repairs, services, etc. at a safe distance on a live electrical utility transmission line, underground cable, switch gear, or other electrical component. The hot stick is a pole of insulating material, such as a fiberglass reinforced plastic pole, up to 3 inches in diameter, and periodically the leakage current through the tool must be tested to ensure the safe operation thereof.

Figure 1:
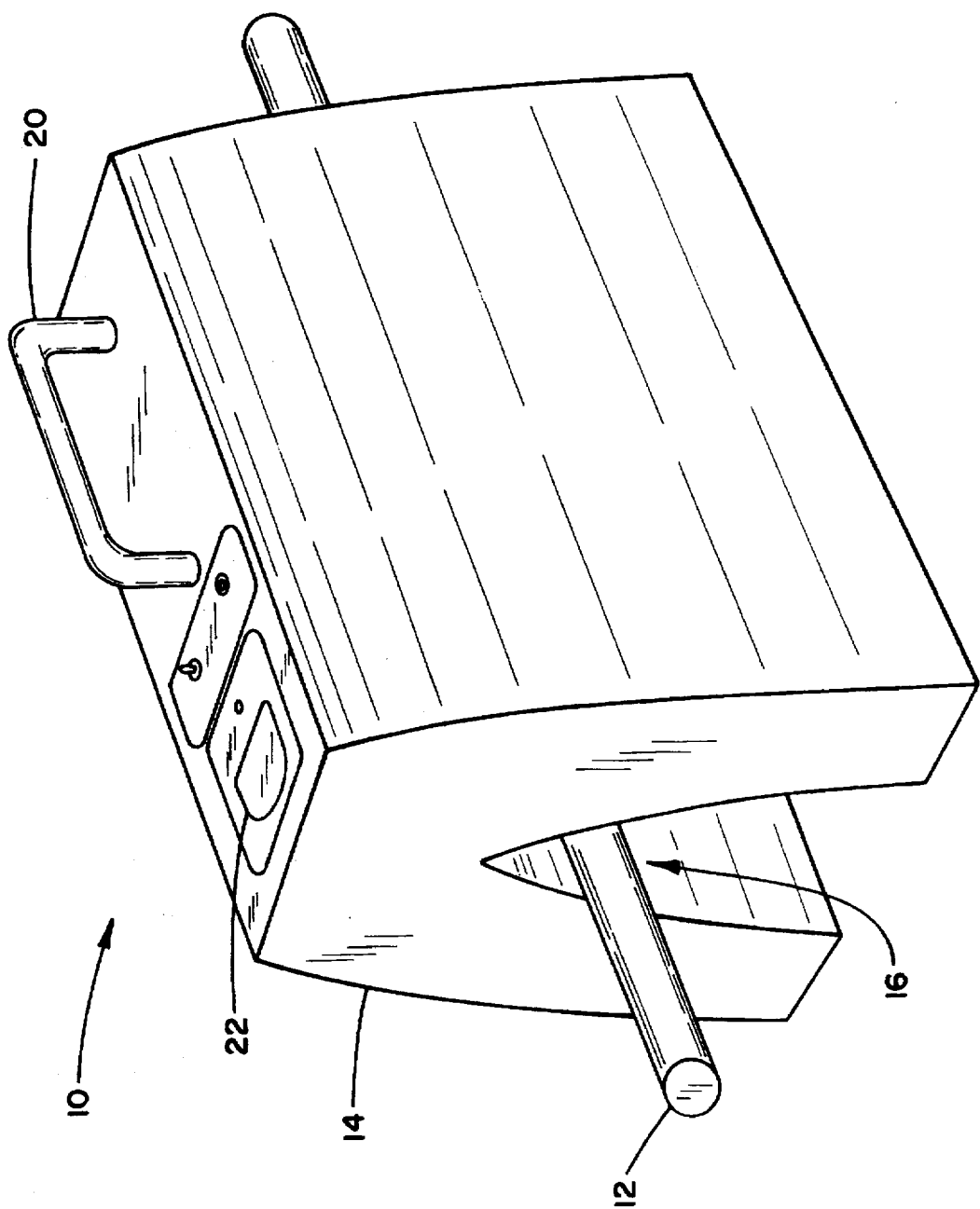
FIG. 1 is a front perspective view of a portable, self-contained wet/dry hot stick tester unit pursuant to the present invention for checking the insulation integrity of an electrical live-line tool constructed of fiber-glass-reinforced plastic by testing the leakage current through the tool when a given test voltage is applied thereto.
Figure 2:
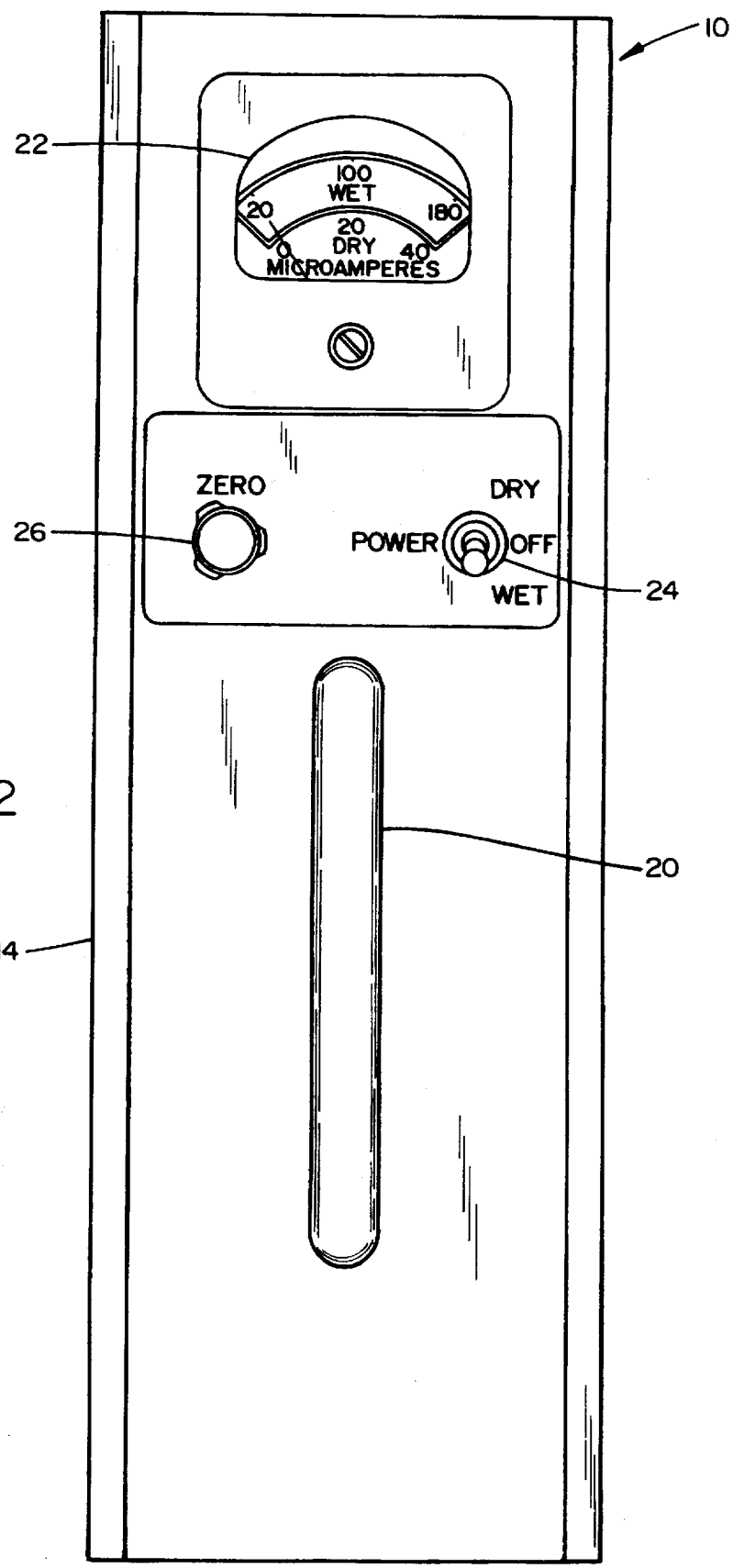
FIG. 2 is a top plan view of the instrument and controls mounted on top of the portable, self-contained wet/dry hot stick tester unit of FIG. 1.

Referring to the drawings in detail, FIG. 1 is a front perspective view of a portable, self-contained wet/dry hot stick tester unit 10 pursuant to the present invention. The wet/dry hot stick test checks the insulation integrity of an electrical live-line tool 12 by testing the leakage current through the tool when a given test voltage is applied thereto. FIG. 2 is a top plan view of the instrument and controls mounted on top of the portable, self-contained wet/dry hot stick tester unit shown in FIG. 1.

The test unit 10 shown in FIGS. 1 and 2 includes an inverted V shaped reading aperture 16 which is placed over and around a hot stick 12 being tested. The tester unit 10 has output electrodes 18, FIG. 3, positioned along the length of a hot stick 12 positioned within the reading aperture 16. The test unit includes a handle 20 positioned on the top of the unit console 14 for grasping and manipulating the unit, a measured leakage current ammeter 22, a three way power switch 24 having OFF, DRY and WET positions, and a zero adjust knob 26 for initially zeroing the meter reading of the current ammeter 22.

Figure 3:
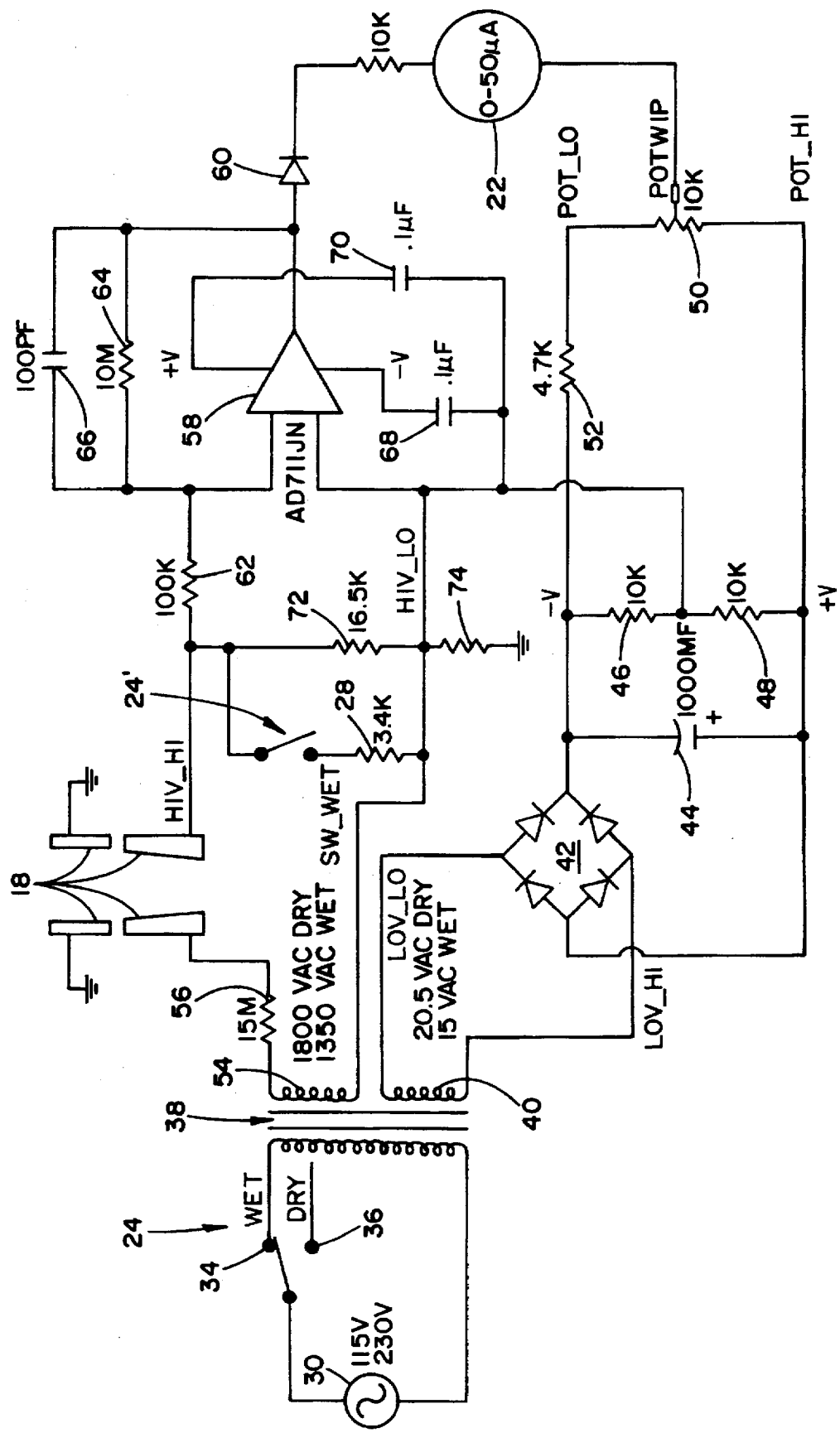
FIG. 3 is a schematic electrical diagram of the power supply and control circuit for the portable, self-contained wet/dry hot stick tester unit shown in FIGS. 1 and 2.

FIG. 3 is a schematic electrical diagram of the power supply and control circuit for the portable, self-contained wet/dry hot stick tester unit 10 shown in FIG. 1 and 2. An input AC power supply 30, either nominally 115 VAC or 230 VAC, is directed as an input to the wet/dry switch 24 to either a wet tap 34 or a dry tap 36 of a two tap step up voltage transformer 38. The wet/dry switch 24 comprises a ganged switch which functions at 24 to switch the transformer between appropriate taps, and functions at 24' to switch the circuit output of the electrodes 18, and more particularly switches a resistor 28 into and out of the control circuit between the output of electrodes 18 and one output of transformer coil 54 and an input to an operational amplifier 58.

A lower output winding 40 of the transformer 38 is used in a general power supply circuit, and the output is rectified, i.e. by a diode bridge 42, the output of which is smoothed by a capacitor 44. Capacitor 44 also filters out higher frequencies from the measuring circuitry. Two resistors 46 and 48 are connected in a voltage divider network. A potentiometer 50, coupled to zero adjust knob 26, is connected through a resistor 52 to the rectifier circuit 42, and provides a zero adjustment for the output ammeter 22.

The output of an upper output winding 54 of the transformer 38 proceeds serially through a safety current limiting resistor 56 and across the output electrodes 18 which are positioned adjacent the reading aperture 16 of the instrument, and then into a portion of the circuit driven by an operational amplifier 58, the output of which drives the ammeter 22 to measure the leakage current through the hot stick 12 being tested.

The output of the circuit is provided by a 0–50 u A DC ammeter 22, which is driven by the op amp 58, the output of which is rectified, i.e. by diode 60, prior to entering the ammeter. The gain of the op amp 58 is controlled by resistors 62, 64, the latter of which has a parallel capacitor 66 which provides a filter for high frequency noise. Two capacitors 68, 70 are provided to stabilize operation of the op amp 58. Resistors 28,72 convert the leakage current to a voltage for input to op amp gain resistor 62.

The two tap transformer 38 is provided to provide two separate output voltages, a first output voltage for dry measurements which applies a voltage equivalent to 100 KV/ft to the hot stick being tested, and a second output voltage for wet measurements which applies a voltage equivalent to 75 KV/ft to the hot stick being tested. The two tap transformer has two separate input taps, a first tap 34 connecting a coil with a first number of turns into the input winding of the transformer to produce an output voltage equivalent to 100 KV/ft to the hot stick, and a second tap 36 connecting a coil with a second number of turns into the input winding of the transformer to produce an output voltage equivalent to 75/KV/ft to the hot stick.

The upper output coil 54 of the transformer circuit produces the output voltage for the dry test switch position, and the output voltage for the wet test switch position. The lower output coil 40 of the transformer circuit produces an output of 20.5 VAC in the dry switch position, and an output of 15 VAC in the wet switch position.

The following is an exemplary set of operating instructions for the wet/dry hot stick tester unit.

Before turning the power switch to the "WET or DRY" positions, turn the Zero knob to the "ZERO" setting (fully counterclockwise). Damage to the meter could result if the Zero knob is at the maximum setting (fully clockwise position) when the unit is turned on.

After turning the power switch to the "DRY" position and with nothing in the open test area of the electrodes, rotate the Zero knob until the meter needle aligns with the line on the meter face indicated by the words "ZERO TO LINE". This is the position the meter needle should return to after every test. Placing a Check Bar (which is a reference check bar or hot stick) in the tester should result in a near full deflection of the meter needle.

1. Dry test:

The dry test should be conducted with the power switch in the "DRY" position.

a. After turning the power switch to the "DRY" position and with nothing in the open test area of the electrodes, rotate the Zero knob until the meter needle aligns with the line on the meter face indicated by the words "ZERO TO LINE".

b. To begin testing, support the stick at both ends and place the tester on the stick. Take overlapping readings from one end of the stick to the other end.

c. Rotate the stick and test it again from end to end. Continue in this manner until all four quadrants around the pole circumference are thoroughly tested.

2. Wet test:

Cleaning prior to testing:

Prior to testing, thoroughly clean each stick with a suitable cleaning solvent and a nonabrasive cloth. Apply the solvent liberally over the entire stick and wipe away contaminates with the cloth.

The wet test should be conducted with the power switch in the "WET" position.

a. After turning the power switch to the "WET" position and with nothing in the open test area of the electrodes, rotate the Zero knob until the meter needle aligns with the line on the meter face indicated by the words "ZERO TO LINE".

b. For wet testing the hot stick should be horizontal. Using a mist applicator mist the stick with distilled water, evenly, over the entire surface, from end to end. Avoid over wetting and discontinue spraying before the beads of water form a continuous line. A continuous line will provide a current path through the water and falsely indicate failure. The objective is for the water to bead up on a glossy surface.

c. Follow the testing procedures in Section (Dry Testing) b. and c. except the voltage should be applied to each tested section before continuing to the next section of the stick.

The lower (Dry) scale is read when the power switch is in the Dry position. The meter reads the leakage current on the hot stick when a voltage equivalent to 100 KV/ft. is applied to the stick. The upper (Wet) scale is read when the power switch is in the Wet position. The meter reads the leakage current on the hot stick when a voltage equivalent to 75 KV/ft is applied to the stick.

There are Three Critical Meter Indications

1. A high leakage current reading can be caused by such problems as contamination on the stick, moisture or carbon tracks on the surface or in the wall of the stick. Any sticks registering this kind of reading should be removed from service until the problem is identified and remedied.

To eliminate surface contamination as the cause, clean the stick and repeat the test. A failure after properly cleaning, waxing or refinishing and retested indicates an internal problem. The stick should be removed from further service.

2. Nonuniformity in readings taken at various locations along the hot stick. Example: The first five consecutive readings on a stick are slightly above the Zero line. the sixth line reading has a considerably higher leakage current. The remainder of the readings fall near the Zero line. The nonuniformity of the sixth reading should be retested by rotating the stick to get a maximum reading. Rotating the pole may result in a high leakage current reading.

In any case, nonuniformity should be checked by inspecting for localized surface contamination, cracking or other damage to the pole, a patched pole or a plugged pole (The latter condition is often noted on side rails of fiberglass-pole ladders where the rungs connect to the rails).

3. In some cases, the leakage current will continue to rise as the stick is being tested. This stick should be cleaned and retested. If this condition is not corrected, the pole should be removed from service.

While several embodiments and variations of the present invention for a wet/dry hot stick tester are described in detail herein, it should be apparent that the disclosure and teachings of the present invention will suggest many alternative designs to those skilled in the art.

What is claimed is:

1. A wet/dry hot stick tester comprising:
   (a) output electrodes positioned along opposite sides of the length of a reading aperture provided in a housing of the hot stick tester, in which a hot stick being tested is positioned such that the output electrodes are positioned on opposite sides of and along the portion of the length of the hot stick being tested;
   (b) a two tap transformer having a first input tap for providing a first voltage equivalent to a first KV/ft to a hot stick positioned in the reading aperture by the output electrodes positioned on opposite sides of and along the portion of the length of the hot stick being tested during a dry test thereof during which the surface of the hot stick is maintained in a dry condition, and having a second input tap for providing a second voltage equivalent to a second KV/ft to a hot stick positioned in the reading aperture by the output electrodes positioned on opposite sides of and along the portion of the length of the hot stick being tested during a wet test thereof during which the surface of the hot stick is maintained in a wetted condition; and
   (c) an ammeter for measuring leakage current through a hot stick positioned in the reading aperture during an applied voltage.

2. A wet/dry hot stick tester as claimed in claim 1, wherein the tester comprises a portable self-contained unit for checking the insulation integrity of a hot stick.

3. A wet/dry hot stick tester as claimed in claim 2, wherein a wet/dry switch is provided for switching the two tap transformer between the first and second input taps.

4. A wet/dry hot stick tester as claimed in claim 3, wherein the wet/dry switch comprises a ganged switch, a first set of contacts of which switches between the first and second input taps of the transformer, and a second set of contacts of which switches a resistor in and out of a control circuit between the output electrodes and an input to an operational amplifier which drives the ammeter.

5. A wet/dry hot stick tester as claimed in claim 4, wherein the reading aperture comprises an inverted V shaped aperture which is placed over and around a hot stick being tested.

6. A wet/dry hot stick tester as claimed in claim 1, wherein a wet/dry switch is provided for switching the two tap transformer between the first and second input taps.

7. A wet/dry hot stick tester as claimed in claim 6, wherein the wet/dry switch comprises a ganged switch, a first set of contacts of which switches between the first and second input taps of the transformer, and a second set of contacts of which switches a resistor in and out of a control circuit between the output electrodes and an input to an operational amplifier which drives the ammeter.

8. A wet/dry hot stick tester as claimed in claim 7, wherein the reading aperture comprises an inverted V shaped aperture which is placed over and around a hot stick being tested.

9. A wet/dry hot stick tester as claimed in claim 1, wherein the reading aperture comprises an inverted V shaped aperture which is placed over and around a hot stick being tested.

* * * * *